US006273969B1

(12) United States Patent
Dutta et al.

(10) Patent No.: US 6,273,969 B1
(45) Date of Patent: Aug. 14, 2001

(54) ALLOYS AND METHODS FOR THEIR PREPARATION

(75) Inventors: Partha S. Dutta, Troy; Aleksandar G. Ostrogorsky, Cllifton Park, both of NY (US)

(73) Assignee: Rensselaer Polytechnic Institute, Troy, NY (US)

( * ) Notice: Subject to any disclaimer, the term of this patent is extended or adjusted under 35 U.S.C. 154(b) by 0 days.

(21) Appl. No.: 09/061,883

(22) Filed: Apr. 17, 1998

Related U.S. Application Data

(60) Provisional application No. 60/070,668, filed on Jan. 7, 1998.

(51) Int. Cl.[7] .............................. C22C 12/00; C22C 28/00
(52) U.S. Cl. .......................... 148/404; 420/576; 420/579; 420/555; 420/526; 252/62.3 GA; 252/62.3 ZB; 252/62.3 V; 252/62.3 C
(58) Field of Search ...................................... 148/404, 442, 148/437, 580, 903; 420/579, 576, 555, 528, 525, 526, 513; 252/62.3 GA, 62.37 B, 62.37 T, 62.3 V, 62.3 C

(56) References Cited

U.S. PATENT DOCUMENTS

| 3,767,472 | 10/1973 | Chicotka et al. . |
| 3,867,202 | 2/1975 | Ichiki et al. . |

(List continued on next page.)

FOREIGN PATENT DOCUMENTS

| 48071398 | 9/1973 | (JP) . |
| 49121478 | 11/1974 | (JP) . |
| 50035098 | 4/1975 | (JP) . |
| 50-075596 | 6/1975 | (JP) . |
| 50075595 | 6/1975 | (JP) . |
| 53-026280 | 3/1978 | (JP) . |

OTHER PUBLICATIONS

Nakajima et al., "The Pseudo–quarternary Phase Diagram of the Ga–In–As–Sb System," *J. Crystal Growth*, 41:87–92 (1977).
Bachmann et al., "Melt and Solution Growth of Bulk Single Crystals of Quaternary III–V Alloys," *Progress in Crystal Growth and Characterization*, 2:171–206 (1979).

(List continued on next page.)

*Primary Examiner*—Deborah Yee
(74) *Attorney, Agent, or Firm*—Nixon Peabody LLP

(57) ABSTRACT

The present invention relates to an alloy comprising a first element A, a second element B, a third element C, and a fourth element D. In the alloy, first element A and second element B are present as a binary compound AB, and third element C and fourth element D are present as a binary compound CD. In addition, the alloy is substantially free from binary compounds AD, BC, AC, and BD. These alloys can be characterized as semiconducting, quasi-binary, single phase alloys having the formula $(AB)_x(CD)_{1-x}$, where x is between 0 and 1 and where A, B, C, and D are different. The present invention also relates to a method of producing an alloy. The method includes providing a first binary material AB and providing a second binary material CD. The first binary material AB and the second binary material CD are contacted under conditions effective to mix the first binary material AB and the second binary material CD without decomposing either the first binary material AB or the second binary material CD. The quasi-binary alloys of the present invention are substantially different from the typical quaternary $A_xB_{1-x}C_yD_{1-y}$ alloys that are prepared using known conventional methods. In addition, alloys of the present invention are significantly less expensive and have structural, optical, and electrical properties that are significantly different when compared to conventional quaternary alloys and growth techniques, making them particularly well suited for use as semiconductors, such as for the thermovoltaic generation of electricity and infrared detection.

32 Claims, 8 Drawing Sheets

U.S. PATENT DOCUMENTS

| | | |
|---|---|---|
| 3,873,458 | 3/1975 | Parkinson . |
| 3,880,677 | 4/1975 | Nishizawa et al. . |
| 3,979,271 | 9/1976 | Noreika et al. . |
| 4,279,670 | 7/1981 | Steele . |
| 4,315,796 | 2/1982 | Nishizawa . |
| 4,399,097 | 8/1983 | Gallagher et al. . |
| 4,662,980 | 5/1987 | Triboulet et al. . |
| 5,047,113 | 9/1991 | Ostrogorsky . |

OTHER PUBLICATIONS

Ostrogorsky, "Numerical Simulation of Single Crystal Grown by Submerged Heater Method," *J. Crystal Growth*, 104:233–238 (1990).

Lazzari et al., "Growth Limitations by the Miscibility Gap in Liquid Phase Epitaxy of $Ga_{1-x}In_xAs_ySb_{1-y}$ on GaSb," *Mater. Sci. Eng. B*, 9:125–128 (1991).

Sundaram et al., "GaSb Based Ternary and Quaternary Diffused Junction Devices for TPV Applications," pp. 105–115 in Benner et al., eds., *Thermophotovoltaic Generation of Electricity: Third NREL Conference*, The American Institute of Physics (1997).

Zunger, "Spontaneous Atomic Ordering in Semiconductor Alloys: Causes, Carriers, and Consequences," *Mrs Bulletin*, Jul. 1997.

Brodovoi et al., "Optical Properties of Crystals of the Solid Solutions $(InSb)_{1-x}(CdTe)_x$," *Semiconductors*, 32:274–276 (1998).

Marin et al., "Bulk Growth of Quasi–Binary Quaternary Alloys," *J. Crystal Growth*, 211:194–201 (2000).

ALLOYS AND METHODS FOR THEIR PREPARATION

This application claims the benefit of U.S. Provisional Patent Application Ser. No. 60/070,668, filed Jan. 7, 1998, which is hereby incorporated by reference.

FIELD OF THE INVENTION

The present invention relates to alloys and, more particularly, to quasi-binary alloys and methods for making same.

BACKGROUND OF THE INVENTION

Ternary semiconductor alloys can be obtained by solidifying a melt or solution of three elements. Generally, this is done by melting appropriate amounts of three elements, typically denoted A, B, and C, together. For example, an amount x of A, a unit amount of B, and an amount 1−x of C, where x is equal to 0 to 1 times the unit amount of B that is present, can be melted together to form the ternary. In the melt or solution, $A_x$ and $C_{1-x}$ react with B to form two molten binaries $(AB)_x$ and $(CB)_{1-x}$. Solidification of these molten binaries produces an alloy having the formula $A_xBC_{1-x}$. Alternatively, the process can be carried out by first mixing two separately prepared binaries having he formulae $(AB)_x$ and $(CB)_{1-x}$ and solidifying the mix to produce an alloy having the formula $A_xBC_{1-x}$.

In practice, growing ternaries from melts becomes difficult due to wide separation between the solidus-liquidus curves of the pseudo-binary phase diagram. This arises primarily because of differences in lattice constants (sometimes dubbed "lattice mismatch") and melting points of the alloys' constituent binaries. As a result, the dissimilar properties, in particular, dissimilarities in lattice constants, give rise to defects in the alloy crystals. Such defects include dislocations, mechanical cracks, non-uniform composition (for example, due to segregation), inclusions, precipitates, dendrites, and the like. For example, InGaSb in which In makes up more than about 10% cannot be prepared without the occurrence of defects.

To overcome these problems, at present, ternary crystals are produced in the form of thin layers, by a method commonly referred to as epitaxial growth. Typically, this is carried out by non-equilibrium growth techniques from dilute solutions or from a vapor phase on binary substrates by compositionally graded buffers. However, epitaxial growth techniques are expensive, and, when used to grow semiconductor alloys, these techniques increase the cost of the alloy by several fold. Moreover, the yield and performance of such alloys are reduced, as compared with non-epitaxially grown alloys.

Similar problems are encountered in growing quaternary alloys. Miscibility gaps in the pseudo-quaternary plane and phase separation are the main obstacles for the solidification of quaternary alloys from melts (Lazzari et al., "Growth Limitations by the Miscibility gap in Liquid Phase Epitaxy of $Ga_{1-x}In_xAs_ySb_{1-y}$ on GaSb," *Mater. Sci. Eng. B*, 9:125–128 (1991); Nakajima et al., "The Pseudo-quaternary Phase Diagram of the Ga-In-As-Sb System," *J. Crystal Growth*, 41:87–92 (1977); and Bachmann et al., "Melt and Solution growth of Bulk Single Crystals of Quaternary III–V Alloys," *Progress in Crystal Growth and Characterization*, 2:171–206 (1979) ("Bachmann")) and result in alloys which contain substantial defects. These miscibility gaps and phase separation are primarily the result of differences in the chemical interaction between the constituent elements in the melt. To overcome these obstacles, alloys having reduced defects can be prepared by using special solidification techniques, such as the submerged heater method described in Ostrogorsky, "Numerical Simulation of Single Crystal Grown by Submerged Heater Method," *J. Crystal Growth*, 104:233–238 (1990) ("Ostrogorsky I") and U.S. Pat. No. 5,047,113 to Ostrogorsky ("Ostrogorsky II"). However, even these techniques are not capable of preventing high densities of mechanical cracks related to lattice mismatch. Furthermore, preparation of high quality quaternary alloys using the aforementioned special techniques is expensive and raises the cost of the final product significantly.

For these and other reasons there remains a need for high quality alloys having low incidence of mechanical defects and for methods for preparing such alloys. The present invention is directed to meeting this need.

SUMMARY OF THE INVENTION

The present invention relates to an alloy comprising a first element A, a second element B, a third element C, and a fourth element D. In the alloy, first element A and second element B are present as a binary compound AB, and third element C and fourth element D are present as a binary compound CD. In addition, the alloy is substantially free from binary compounds AD, BC, AC, and BD.

The present invention also relates to a method of producing an alloy. The method includes providing a first binary material AB and providing a second binary material CD. The first binary material AB and the second binary material CD are contacted under conditions effective to mix the first binary material AB and the second binary material CD without decomposing either the first binary material AB or the second binary material CD.

The quasi-binary alloys of the present invention are substantially different from the typical quaternary $A_xB_{1-x}C_yD_{1-y}$ alloys that are prepared using known conventional methods. In addition, alloys of the present invention are significantly less expensive and have structural, optical, and electrical properties that are significantly different when compared to conventional quaternary alloys and growth techniques, making them particularly well suited for use as semiconductors, such as for the thermo-voltaic generation of electricity and infrared detection.

BRIEF DESCRIPTION OF THE DRAWINGS

(FIG. 2A); from Ga, In, Sb, and GaAs at 950° C. (FIG. 2B); and from Ga, In, Sb, and GaAs at 800 ° C. (FIG. 2C).

In FIGS. 4A and 4B, the solid squares and diamonds, respectively, represent data for an alloy crystallized by the Bridgman method and by the Czochralski method.

DETAILED DESCRIPTION OF THE INVENTION

Figure 1:
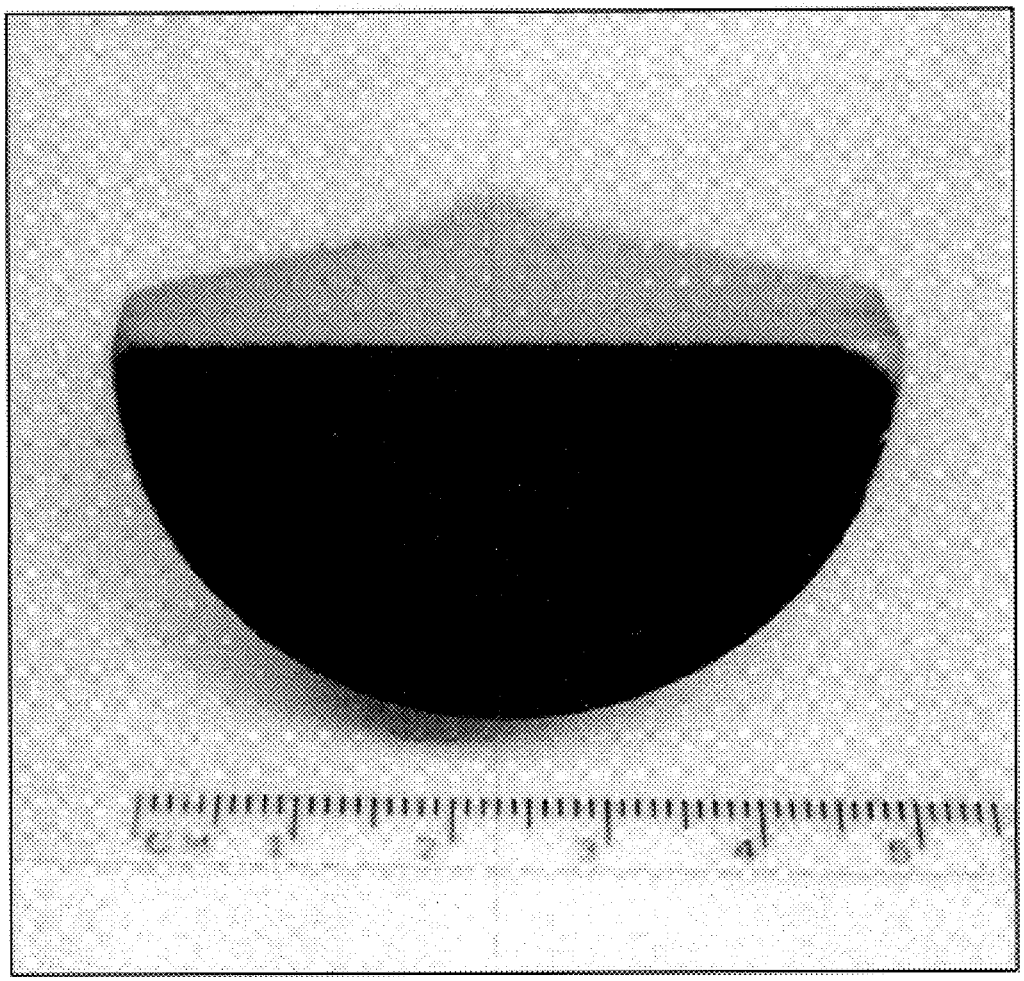
FIG. 1 is a photograph of an as-grown single crystal of an alloy prepared in accordance with a method of the present invention.

The present invention relates to an alloy comprising a first element A, a second element B, a third element C, and a fourth element D. In the alloy, first element A and second element B are present as a binary compound AB, and third element C and fourth element D are present as a binary compound CD. Additionally, the alloy is substantially free from binary compounds AD, BC, AC, and BD. An alloy is substantially free of AD, BC, AC, and BD when the cumulative amounts of AD, BC, AC, and BD are sufficiently low so as not to give rise to multiple phases. For example, for purposes of the present invention, an alloy is substantially free of AD, BC, AC, and BD when the aggregate number of moles of AD, BC, AC, and BD divided by the number of moles of AB and CD is less than about 1000 parts per million ("ppm"), preferably less than about 100 ppm, more preferably less than about 10 ppm.

Except for minor amounts of impurities or dopants which may be present in the alloy, it is preferred that each first element A and each second element B are present as a binary compound AB, and each third element C and each fourth element D are present as a binary compound CD. As used herein, binary compounds include those compounds which consist of two elements, for example A and B (or C and D), which are directly bonded to each other. Where the binary consists of A and B, each element A is directly bonded to each element B. In the case where the binary's two constitutive elements are designated C and D, each element C is directly bonded to each element D. As indicated above, the bond between the two elements constituting the binary compound is direct, i.e., there is no intervening element or group of elements.

Generally, binary compound AB and binary compound CD will possess similar lattice constants. For example, it is preferred that the ratio of binary compound AB's lattice constant to binary compound CD's lattice constant be from about 0.95 to about 1.05, preferably from about 0.98 to about 1.02. Particularly preferred combinations of AB and CD are those where the ratio of the lattice constant of binary AC to that of binary BD or where the ratio of binary AD's lattice constant to that of binary BC is greater than about 1.02 or less than about 0.98, particularly greater than about 1.05 or less than about 0.95. Lattice constants for many binaries have been previously determined and compiled in, for example, Weast et al., eds., *CRC Handbook of Chemistry and Physics*. 60th ed., Florida:CRC Press, Inc. (1980) ("Weast"), which is hereby incorporated by reference. Where lattice constant data for a binary compound is not available, it can be obtained using the methods described in Goldschmidt, *Skrifter Norsheride—Akads. Oslo I: Mat. Naturv. kl. VIII* (1926) and Giesecke et al.,*Acta Crystallogr.*, 11:369 (1958), which are hereby incorporated by reference. Illustratively, the lattice constant for GaSb, InAs, AlSb, CdSe, ZnTe, InSb, CdTe, HgTe, InP, CdS, GaAs, ZnSe, AlAs, GaP, ZnS, AlP, HgSe, and HgS are 6.0954, 6.05838, 6.1355, 6.05, 6.101, 6.47877, 6.477, 6.460, 5.86875, 5.5818, 5.65315, 5.6676, 5.6622, 5.4505, 5.4093, 5.451, 6.084, and 5.8517.

The combination of elements which make up the binaries contained in the alloys of the present invention can be any combination which forms a stable binary compound. Particularly preferred alloys of the present invention are those where A is a Group IIIA element and B is a Group VA element or where A is a group IIB element and B is a group VIA element and where C is a Group IIIA element and D is a Group VA element or C is a Group IIB element and D is a Group VIA element. That is, for example, A can be a Group IIIA element, B can be a Group VA element, C can be Group IIIA element, and D can be a Group VA. Alternatively, A can be a Group IIIA element, B can be a Group VA element, C can be a Group IIB element, and D can be a Group VIA element. Still alternatively, A can be Group IIB element, B can be a Group VIA element, C can be a Group IIIA element, and D can be a Group VA. Still alternatively, A can be a Group IIB element, B can be a Group VIA element, C can be a Group IIB element, and D can be a Group VIA element. Examples of Group IIB elements are Zn, Cd, and Hg; examples of Group IIIA elements are B, Al, Ga, In, and Tl; examples of Group VA elements are N, P, As, Sb, and Bi; and examples of Group VIA elements are O, S, Se, Te, and Po. Preferably, A and C are different elements, and B and D are different elements. More preferably, A, B, C, and D are all different.

The alloy of the present invention can be represented with the formula $(AB)_x(CD)_{1-x}$, where A and B represent the elements which make up binary compound AB, where C and D represent the elements which make up binary compound CD, and where x is between 0 and 1. The value of x will depend on the properties of the component binaries and the desired properties of the alloy. Suitable values for x include those in the range from about 0 to about 0.2 or from about 0.8 to about 1. In some instances, for example, where AB is InAs and CD is GaSb and the desired band gap of the alloy is from about 0.5 to about 0.6 eV, x can be from about 0.1 to about 0.2, preferably from about 0.03 to about 0.15.

Illustrative embodiments of the present invention include those where A is Ga, B is Sb, C is In, and D is As; where A is Al, B is Sb, C is In, and D is As; where A is Cd, B is Se, C is Zn, and D is Te; where A is Al, B is Sb, C is Zn, and D is Te; where A is Ga, B is Sb, C is Zn, and D is Te; where A is In, B is As, C is Zn, and D is Te; where A is Ga, B is Sb, C is Cd, and D is Se; where A is In, B is As, C is Cd, and D is Se; where A is Al, B is Sb, C is Cd, and D is Se; where A is In, B is Sb, C is Cd, and D is Te; where A is In, B is Sb, C is Hg, and D is Te; where A is In, B is P, C is Cd, and D is S; where A is Ga, B is As, C is Zn, and D is Se; where A is Al, B is As, C is Zn, and D is Se; where A is Ga, B is P, C is Zn, and D is S; where A is Al, B is P, C is Zn, and D is S; where A is In, B is P, C is Hg, and D is S; where A is In, B is As, C is Hg, and D is Se; where A is Al, B is Sb, C is Hg, and D is Se; and where A is Ga, B is Sb, C is Hg, and D is Se. Specific illustrative embodiments of the alloys of the present invention include those represented by the formulae $(GaSb)_x(InAs)_{1-x}$, $(AlSb)_x(InAs)_{1-x}$, $(CdSe)_x(ZnTe)_{1-x}$, $(AlSb)_x(ZnTe)_{1-x}$, $(GaSb)_x(ZnTe)_{1-x}$,$(InAs)_x(ZnTe)_{1-x}$,$(GaSb)_x(CdSe)_{1-x}$,$(InAS)_x(CdSe)_{1-x}$, $(AlSb)_x(CdSe)_{1-x}$, $(InSb)_x(CdTe)_{1-x}$, $(InSb)_x(HgTe)_{1-x}$, $(InP)_x(CdS)_{1-x}$, $(GaAs)_x(ZnSe)_{1-x}$, $(AlAs)_x(ZnSe)_{1-x}$, $(GaP)_x(ZnS)_{1-x}$, $(AlP)_x(ZnS)_{1-x}$, $(GaSb)_x(HgSe)_{1-x}$, $(AlSb)_x(HgSe)_{1-x}$, $(InAs)_x(HgSe)_{1-x}$, and $(InP)_x(HgS)_{1-x}$, wherein x is between 0 and 1.

The alloy of the present invention can optionally include a fifth element E and a sixth element F. Preferably, each fifth element E and each sixth element F is present as a binary compound EF, and binary compound EF has a lattice constant that is similar to that of AB and CD. Thus, for example, the alloy of the present invention can have the formula $(AB)_x(CD)_y(EF)_{1-x-y}$, where x is from 0 to 1, y is from 0 to 1, and the sum of x and y is less than 1. In one particularly preferred alloy, A is Al, B is Sb, C is Ga, D is Sb, E is In, and F is As. Alloys having the formula $(AlSb)_x(GaSb)_y(InAs)_{1-x-y}$, where x is from 0 to 1, y is from 0 to 1, and the sum of x and y is less than 1 are contemplated. As one skilled in the art will appreciate, the alloys of the present invention can contain still further binary compounds.

The alloy of the present invention can also contain other materials which may impart desirable properties (e.g., desirable electrical properties) thereto. These include all materials which are commonly used in binary, ternary, and quaternary alloys. An example of one such material is an n-type dopant, such as tellurium, selenium, and sulfur. P-type dopants, such as zinc, cadmium, and the like, can also be used. Preferably, the n-type or p-type dopant is present in the alloy of the present invention in an amount effective to make the alloy an n-type or p-type semiconductor, respectively. Suitable amounts of these types of dopants can range from about 1 ppm to about 1000 ppm, preferably from about 10 ppm to about 100 ppm, per unit weight of the alloy. Preferably, the dopant does not contain any element which is present in the alloy's constituent binaries. For example, where AB is GaSb and CD is ZnTe, it would be preferable to use an n-type dopant other than tellurium or a tellurium containing material. Similarly, when a p-type dopant is used in this material, it would be preferable not to use zinc as the p-type dopant.

Alloys of the present invention having n-type semiconducting properties also include alloys containing AB binaries that are doped with n-type dopants and CD binaries that are doped with p-type dopants, where the amount of n-type dopant contained in the AB binary material is greater than the amount of p-type dopant contained in the CD binary material. Alternatively, an n-type semiconducting alloy of the present invention can include an AB binary material that is doped with p-type dopants and a CD binary that is doped with n-type dopants, where the amount of p-type dopant contained in the AB binary material is less than the amount of n-type dopant contained in the CD binary material. Still alternatively, both AB and CD can be doped with an n-type dopant. In this embodiment, the n-type dopants contained in AB and CD can be the same or different. Still alternatively, n-type semiconductor alloys of the present invention can include an undoped n-type AB binary material and an n-type CD binary material; an undoped n-type AB binary material and a p-type CD binary material; or a p-type AB binary material and an n-type CD binary material. In the latter two cases, the number of free electrons present in the n-type binary material must outweigh the number of holes in the p-type binary material. Yet alternatively, the AB binary material can be a p-type semiconductor, and CD can be doped with an n-type dopant, or the CD binary material can be a p-type semiconductor, and AB can be doped with an n-type dopant. In either case, the number of free electrons provided by the n-type dopant must outweigh the number of holes present in the p-type binary material. Still alternatively, the AB binary material can be an n-type semiconductor, and CD can be doped with a p-type dopant, or the CD binary material can be an n-type semiconductor, and AB can be doped with a p-type dopant. In either case, the number of free electrons provided by the n-type binary material must outweigh the number of holes provided by the p-type dopant.

Alloys of the present invention having p-type semiconducting properties also can contain AB binaries that are doped with p-type dopants and CD binaries that are doped with n-type dopants, where the amount of p-type dopant contained in the AB binary material is greater than the amount of n-type dopant contained in the CD binary material. Alternatively, a p-type semiconducting alloy of the present invention can include an AB binary material that is doped with n-type dopants and a CD binary that is doped with p-type dopants, where the amount of n-type dopant contained in the AB binary material is less than the amount of p-type dopant contained in the CD binary material. Still alternatively, both AB and CD can be doped with a p-type dopant. In this embodiment, the p-type dopants contained in AB and CD can be the same or different. Still alternatively, p-type semiconductor alloys of the present invention can include an undoped p-type AB binary material and an undoped p-type CD binary material; an undoped p-type AB binary material and an n-type CD binary material; or an n-type AB binary material and a p-type CD binary material. In the latter two cases, the number of holes present in the p-type binary material must outweigh the number of free electrons in the n-type binary material. Yet alternatively, the AB binary material can be an n-type semiconductor, and CD can be doped with a p-type dopant, or the CD binary material can be an n-type semiconductor, and AB can be doped with a p-type dopant. In either case, the number of holes provided by the p-type dopant must outweigh the number of free electrons provided by the n-type binary material. Still alternatively, the AB binary material can be a p-type semiconductor, and CD can be doped with an n-type dopant, or the CD binary material can be a p-type semiconductor, and AB can be doped with an n-type dopant. In either case, the number of holes provided by the p-type binary material must outweigh the number of free electrons provided by the n-type dopant.

In all of the above cases, the n-type or p-type semiconducting properties of undoped n-type or p-type binary materials, respectively, can arise from native defects in the binary materials or from residual impurities in the starting materials (i.e., in A, B, C, and/or D).

Preferably, the alloy of the present invention is a single phase material. For example, the alloy of the present invention can be in the form of a single crystal, such as one having a volume preferably greater than about 1 mm$^3$, more preferably greater than 8 mm$^3$. Furthermore, in many applications, it is preferred that the constituent binaries AB and CD are semiconducting materials and that the alloy is also semiconducting.

The alloys of the present invention can be prepared by the following method, to which the present invention also relates. The method includes providing a first binary material AB and a second binary material CD. The first binary material AB and the second binary material CD are contacted under conditions effective to mix the first binary material AB and the second binary material CD. The conditions under which the first binary material and the second binary material are contacted are also selected so that neither the first binary material AB nor the second binary material CD decomposes. That is, the conditions are selected so that AB and CD remain in binary form (i.e., A remains directly bound to B, and C remains directly bound to D).

Binary materials AB and CD that are suitable for the practice of the method of the present invention include those described above with regard to the present invention's alloys. These binary materials can be separately prepared using conventional methods that are well known to those skilled in the art. Briefly, elemental A and elemental B, in a 1:1 mole ratio, are melted, for example in a crucible using an appropriate heat source, such as a furnace, for example a multi-zone Mellen furnace. Preferably, the reactants are mixed, for example, using a baffle (described in, for example, Ostrogorsky et al., "Normal and Zone Solidification Using the Submerged Heater Method," *J. Crystal Growth*, 137:64–71 (1994), which is hereby incorporated by reference) or a submerged heater or stirrer (for example, described in Ostrogorsky I and Ostrogorsky II, which are hereby incorporated by reference) to promote the binary-formation reaction. The reaction is typically carried out for from about 10 minutes to about 2 hours, preferably from about 30 minutes to about 60 minutes, after which the reaction mixture is cooled to produce a polycrystalline binary material. Further details with regard to the preparation of binary materials can be found, for example, in Hurle et al., ed., *Handbook of Crystal Growth,* Vol. 2A, Amsterdam:Elsevier Science B. V. (1994) ("Hurle"), which is hereby incorporated by reference.

Once the binary materials AB and CD are provided, they are contacted under conditions effective to mix the binaries but ineffective to decompose them. Contacting can be carried out by adding binary material AB to binary material CD, by adding binary material CD to binary material AB, or by simultaneously adding each AB and CD to an appropriate container. Typically, the binary materials AB and CD are contacted in any container that is capably of withstanding the conditions necessary to effect mixing of the binary materials. Generally, these conditions include high temperatures. Accordingly, for example, crucibles made from silica and pyrolytic boron nitride ("pBN") are suitable for carrying out the present invention.

Preferably the binary materials AB and CD are thoroughly mixed. This can be accomplished by homogenizing the binary materials. A variety of methods can be used to homogenize the binary materials AB and CD. For example, homogenizing can be carried out using a baffle, such as the one described in Dutta et al., "Bulk Growth of GaSb and $Ga_xIn_{1-x}Sb$," in Coutts et al., eds., *Proc. of the Third NREL Conference on Thermophotovoltaic Generation of Electricity AIP Conference Proceedings,* 401:157–166 (1997) ("Dutta"), which is hereby incorporated by reference. Alternatively, homogenization can be effected with a submerged heater or stirrer, as described, for example, in Ostrogorsky I and Ostrogorsky II, which are hereby incorporated by reference. Still alternatively, inductive heating, such as from a low frequency induction coil, can be used to stir the mixture. Particulars regarding the use of induction heating can be found, for example, in Hurle, which is hereby incorporated by reference. Homogenization can also be carried out in sealed crucibles, as described, for example, Hilsum et al., *Semiconducting III–V Compounds,* Vol. 1, London:Pergamon Press, Ltd., pp. 89–113 (1961), which is hereby incorporated by reference. Homogenization of the mixture can also be effected by relying on natural convection and diffusion.

To effect mixing, contacting can be carried out by melting the at least one of first binary material AB and the second binary material CD. The temperature at which melting is carried out should be such that neither the first binary material AB nor the second binary material CD is decomposed. For example, the contacting can be carried out at a temperature that is greater than the first binary material melting point or greater than the second binary material melting point and that is less than the first binary material's decomposition temperature and less than the second binary material's decomposition temperature. Preferably, the temperature is greater than both the melting point of the first binary material and the melting point of the second binary material but less than the decomposition temperatures of both materials.

In some cases, it may be desirable to contact the first and second binary materials under a pressure that inhibits decomposition of both the first binary material AB and the second binary material CD. This can be carried out, for example, by pressurizing the chamber in which the binary materials are to be contacted with a gas, preferably, an inert gas (such as helium, argon, or nitrogen). Generally, any pressure greater than the partial vapor pressures of the two binary materials are preferred. By increasing the pressure above the binary reactants, the decomposition temperature of the binary material is can be increased, thus increasing the temperature at which the two binaries can be mixed without causing the binary's decomposition.

If the mixture is not pressurized properly and/or the temperature is increased to above the decomposition temperature of either the first or second binary material (or both), the binary materials will decompose This may give rise to the formation, in the mixture, of binary compounds (e.g., AD and BC) which have lattice constants that differ significantly than those of AB and CD. In this case, the quality of the resulting alloy will be poor. For example, the alloy made under these conditions may be a polycrystalline boule with numerous cracks and multiple phases.

The binary materials can be contacted prior to melting, one of the binary materials can be first melted and then contacted with the other binary material, or both binary materials can be first melted and then contacted. Illustratively, the first binary material can be heated under conditions effective to melt but ineffective to decompose the first binary material AB, the second binary material can be separately heated under conditions effective to melt but ineffective to decompose the second binary material CD, and the melted first binary material AB and the melted second binary material CD is then be contacted under conditions effective to produce the alloy. Separately melting the two binary materials prior to contacting them can be carried out advantageously using a two (or multi) zone furnace, such as a tubular furnace with an axial temperature gradient. Alternatively, where the first binary material AB has a melting point lower than the second binary material CD, the first binary material AB can be heated under conditions effective to melt the first binary material AB but ineffective to decompose the first binary material AB or the second binary material CD, and the second binary material CD can then be added to the melted first binary material AB under conditions effective to dissolve the second binary material CD in the melted first binary material AB.

Rather than contacting the two binary materials at temperatures effective to melt both of the binary materials (i.e., at temperatures greater than or equal to the greater of the melting temperature of first binary material AB and second binary material CD), the lower melting point binary material can be melted at a temperature greater than the melting point of the lower melting binary material but less than that of the higher melting point binary material. The higher melting point binary material can then be dissolved in the molten lower point binary material. For example, various molar percents of InAs from a solid source can be dissolved in GaSb at temperatures between the melting point temperature of GaSb (712° C.) and the melting temperature of InAs (942° C.). When employing this method, the temperature of the melt can be controlled, for example, during a subsequent solidification process (described in more detail below) by dissolving various molar percents of the higher melting point binary material (e.g., InAs) in the lower melting point binary material (e.g., GaSb).

In all cases, melting is best carried out by heating the binary material or materials in a crucible (e.g., a silica and pBN crucible) using a furnace (e.g. a multi-zone Mellen furnace) for a period of time sufficient to thoroughly melt the binary material or materials and permit thermal equilibrium to be established within the melted binary material or materials.

Once the melt is produced it can be solidified, for example, by the methods set forth below. This can involve reducing the melt's temperature, for example, by discontinuing heating or slowly reducing the heat output of the furnace in which the heating was effected. Alternatively, when the mixing is carried out at temperatures which are approximately at or below the melting point of the alloy, solidification can proceed at the temperature at which the mixing was carried out. This is preferred in many cases, especially where single crystal growth is desired, because it avoids precipitation of the alloy.

Preferably, the solidifying is carried out under conditions effective to produce a single crystal. Generally, this involves a slow and controlled process. For example, directional solidification techniques, such as those described in Hurle, which is hereby incorporated by reference, can be employed. These directional solidification techniques are meant to include vertical or horizontal gradient freeze techniques, as well asdirectional solidification techniques which employ baffles (such as those described in Hurle, which is hereby incorporated by reference), submerged heaters (described, for example, in Ostrogorsky I and Ostrogorsky II, which are hereby incorporated by reference), or the like. Alternatively, the melt can be solidified using the Czochralski method (which is meant to include the Liquid Encapsulated Czochralski ("LEC") method and Czochralski methods which employ inert gas overpressure and/or seed crystals), which is described, for example, in Hurle, which is hereby incorporated by reference. In the case where the binary materials are GaSb and InAs, GaSb seed can be used in the Czochralski method for alloys with low solidification temperatures (i.e., where the alloy has low InAs molar content). InAs seed can be used in the Czochralski method, irrespective of the GaSb/InAs molar ratio in the alloy. Various Bridgman methods, including the vertical Bridgman method and the horizontal Bridgman method can be employed. The Bridgman method is generally described in Hurle, which is hereby incorporated by reference. Optionally, the Bridgman method can employ a submerged heater (described, for example, in Ostrogorsky I and Ostrogorsky II, which are hereby incorporated by reference), a baffle to reduce natural convection (thus preventing mixing of the bulk melt from the melt near the growth surface, commonly referred to as diffusion controlled growth) or to promote mixing (commonly referred to as forced convection), or a stirrer to mix the melt. The floating zone method (described, for example, in Hurle, which is hereby incorporated by reference) and other zone solidification methods (such as those described in Sundaram et al., "GaSb Based Ternary and Quaternary Diffused Junction Devices for TPV Applications," pp. 105–115 in Coutts et al., eds., *Proc. of the Third NREL Conference on Thermophotovoltaic Generation of Electricity Colorado Springs, Colo. (AIP Conference Proceedings,* 401:105–115 (1997), which is hereby incorporated by reference) can also be used to promote single crystal growth.

Additionally or alternatively to the methods described above, single crystal solidification can be carried out by contacting the melt with a seed crystal. Contact of the seed crystal with the melt can be effected by simply dipping the seed crystal, optionally attached to a substrate, into the solution. Preferably, the seed crystal has a lattice constant similar to the alloy lattice constant and a melting point higher than the first binary material melting point and higher than or equal to the second binary material melting point. In addition, it is preferred that the seed crystal have a lattice constant similar to the lattice constant of the alloy. For example, seed crystals are preferably chosen such that the ratio of the seed crystal's lattice constant to the lattice constant of the alloy is from about 0.95 to about 1.05, more preferably, from about 0.98 to about 1.02. Lattice constants of alloys that have not yet been formed can be estimated from Weast, which is hereby incorporated by reference. Typically, the lattice constants of alloys produced by the method of the present invention will have a lattice constant that is similar to the lattice constants of first binary material AB and second binary material CD. Therefore, single crystals of the binary material AB or the binary material CD, preferably from the higher melting binary material (to prevent seed melting, can be used advantageously as seed crystals.

Tip nucleation, in a closed vessel or open vessel and with or without the use of seed crystals, can also be employed to effect single crystal growth. Tip nucleation methods are described in, for example, Hurle, which is hereby incorporated by reference. Pulling methods, which are described, for example, in Hurle, which is hereby incorporated by reference, can also be used.

The binary materials used in the practice of the present invention can vaporize at the high temperatures typically used to melt them or at which solidification takes place. In such situations, it can be advantageous to encapsulate the melt during the contacting (e.g., melting) and/or the solidifying steps of the process. This method is commonly referred to as liquid encapsulation. Briefly, an encapsulant is layered over the mixture of binary materials, either before or after the binary material or materials are melted. The encapsulant, having a melting point significantly lower than the binary materials, melts and forms a liquid layer on the surface of the binary material. This liquid layer prevents evaporation of the binary materials from the melt surface and, thereby, preventing unexpected changes to the composition of the alloy. Suitable encapsulants include boric oxide ($B_2O_3$) glass and various low vapor pressure salts, such as metal halide salts, combinations of two or more alkali metal halide salts (e.g., LiCl/KCl and NaCl/KCl, or combinations of alkali metal salts and alkaline earth metal halide salts (e.g., $NaCl/CaCl_2$). Because of its extremely low vapor pressure, boric oxide glass is generally preferred.

Instead of contacting the binary materials under melting conditions to mix the binary materials, the contacting can be carried out in the presence of a solvent and under conditions effective to dissolve at least one of the first binary material and the second binary material in the solvent. Suitable solvents useful for the practice of this aspect of the present invention include tin, bismuth, gallium, indium, antimony, aluminum metals and other substances that are capable of dissolving the binary materials, that are inert to the binary materials, and that are stable to decomposition or rapid vaporization at the temperatures required to dissolve the binary materials. Combinations of solvents, such a mixture of tin and bismuth, can also be employed, and the term "solvent" is meant to include such combinations.

For example, the first binary material is dissolved in a first solvent under conditions effective to form a first solution but ineffective to decompose the first binary material. The second binary material is dissolved in a second solvent under conditions effective to form a second solution but ineffective to decompose the second binary material.

The solvents used for the two solutions can be the same or different. Illustratively, one of the binary materials can be dissolved in tin and the other in bismuth, or, alternatively, the two solutions can be prepared using tin. Of course, the solvents chosen should be miscible with each other. Choice of solvent depends on several factors which will be readily apparent to those skilled in the art, such as the melting points of the solvent and the binary material to be dissolved therein, the solubility of the binary material in the solvent, and the inertness of the solvent to the binary materials. The concentration of the binary materials in their respective solvents is not critical to the practice of the invention. The weight ratio of a binary material to its respective solvent can be from about 2:1 to about 1:50, preferably from about 1:1 to about 1:10. One skilled in the art would be able to predict the amount of solvent needed to solubilize a particular binary by referring to the appropriate phase diagram.

Once the solutions containing the binary materials are prepared, they are mixed under conditions ineffective to decompose either the first binary material or the second binary material. Generally, this means that the mixing should take place at a temperature that is less than both the decomposition temperature of the first binary material AB and the decomposition temperature of the second binary material CD. Optionally, inert gas overpressure and/or liquid encapsulation, as described above, can be employed.

Alternatively, the binary materials can be contacted by dissolving the first binary material in a solvent under conditions effective to form a solution but ineffective to decompose the first binary material. The second binary material, in solid form, is then contacted with the solution containing the first binary material under conditions effective to dissolve the second binary material in the solution but ineffective to decompose the second binary material.

In each case, dissolution of the binary material or materials in their respective solvent or solvents can be carried out by heating the solvent to its melting point in a vessel, such as a crucible (e.g., a silica and pBN crucible) using, for example, an appropriate furnace. The binary material can then added to the molten solvent, preferably in portions, wile maintaining heating until all of the binary material is dissolved. Alternatively, dissolution can be effected by mixing the solid binary material with solid solvent at a temperature below the melting point of the solvent and increasing the temperature until all of the binary material dissolves.

Irrespective of the method used to form the solution containing the first binary material and the second binary material, the alloy can then be crystallized from the solution. This can be effected, for example by reducing the solution's temperature, preferably slowly and more preferably very slowly so that large crystals or, preferably, a single crystal is formed.

Optimally, crystallization is carried out under conditions that produce a single crystal. This can be carried out by any of the methods described above with regard to producing single crystals from melts, such as by contacting the solution with a seed crystal.

Irrespective of whether first binary material AB and second binary material CD are contacted and mixed by the above-described melting process or dissolving process, the method of the present invention can, optionally and additionally, include contacting a third binary material EF with the first binary material AB and the second binary material CD. For example, the third binary material EF can be AlSb, and the alloy prepared by this method can be $(AlSb)_x(GaSb)_y(InAs)_{1-x-y}$, where x is between 0 and 1, y is between 0 and 1, and the sum of x and y is between 0 and 1. AB, CD, and EF are contacted under conditions effective to mix the first binary material AB, the second binary material CD, and the third binary material EF but ineffective to decompose the first binary material AB, the second binary material CD, and, preferably, the third binary material EF. The point at which EF is first contacted with the first and second binary materials is not critical to the practice of this aspect of the present invention. For example, AB, CD, and EF can be mixed before they are melted. Alternatively, AB and CD can be mixed and melted, and, the, EF can be added. Still alternatively, AB and EF can be mixed and melted together, and this mixture can then be mixed with CD. Still alternatively, AB, CD, and EF can be first mixed and then dissolved simultaneously, or they can be dissolved separately and then mixed. Other sequences of melting and mixing, to which the present invention also relates, will be readily apparent to those skilled in the art.

Irrespective of whether first binary material AB and second binary material CD present invention are contacted and mixed by the above-described melting process or dissolving process, the contacting can be carried out in the presence of dopant. Dopants are typically employed to alter or optimize the electrical and transport properties (e.g., lifetime of minority carriers, mobility, resistivity, etc.) of the alloy. The dopant can be an n-type dopant, such as Te, Sn, and S, or a p-type dopant, such as Zn and Cd. Combinations of dopants, such as more than one kind of n-type dopant, more than one kind of p-type dopant, and combinations of one or more n-type dopant and one or more p-type dopant, can also be used. The dopant and AB can be contacted before contacting AB and CD, or AB and CD can be contacted first before either is contacted with the dopant, and then the mixture and the dopant can be contacted. In all cases, the dopant should be contacted with AB and CD before solidification or crystallization commences. Preferably, the dopant is thoroughly mixed with the melt or solution containing AB and CD before solidification or crystallization, such as by any of the mixing techniques described above for AB and CD. Using appropriate dopants, alloys that arc p- or n-type semiconductors can be produced. Other doping strategies can also be used to make p- or n-type semiconducting alloys. These strategies will be evident from the above discussion of the various types of p- and n-type semiconducting alloys of the present invention.

Alternatively or additionally, the individual binaries, AB, CD, and /or EF, can be doped prior to contacting the binaries with each other. For example, the binaries, AB, CD, and /or EF, can be individually doped when they are individually synthesized, as described in Hurle, which is hereby incorporated by reference.

The alloys of the present invention and those prepared in accordance with the methods of the present invention have crystalline and chemical properties that are significantly better than ternary and quaternary crystals. For example, the alloys are substantially free from cracks and other defects. It is believed that this observation is attributable to the ten-fold reduced lattice mismatch of the binaries which constitute that alloy compared to the mismatch that is present in conventionally prepared ternary and quaternary alloys. In addition to being free from mechanical defects, the alloys of the present invention exhibit uniform a uniform phase throughout. This is in contrast to conventionally prepared quaternary alloys, such as those prepared by mixing four separate elements A, B, C, and D, which exhibit phases that are rich in AD and BC in addition to phases that are primarily made of AB and CD. Moreover, the procedure of the present invention is significantly faster and cheaper than epitaxial growth methods that are presently used to produce quaternaries. In addition, the alloys of the present invention exhibit significant band gap narrowing relative to epitaxially grown quaternaries. It is believed that these narrower band gaps are the result of "ordering" of the atoms in the crystal lattice (i.e., the partial absence of randomness or disorder).

The alloys of the present invention and those prepared in accordance with the methods of the present invention can be used, for example, in a variety of applications. For example, they can be used in thermophotovoltaic ("TPV") generation of electricity. Details regarding this use is set forth for example in Coutts et al., eds., *Proc. of the Third NREL Conference on Thermophotovoltaic Generation of Electricity AIP Conference Proceedings*, 401:157–166 (1997), which is hereby incorporated by reference. The alloys can also be used in other applications requiring opto-electronic devices. These include infrared detectors; tandem and other types of solar cells, high frequency devices; monitoring environmental pollution, trace chemicals, and toxic or other types of gases, for example, in industrial environments; fire detection devices; and laser diodes and detectors. By altering the relative amounts of binary material AB and binary material CD in a particular alloy (i.e., by changing x in $(AB)_x(CD)_{1-x}$), the band gap can be tuned for a particular application.

The present invention is further illustrated by the following examples.

EXAMPLES

Example 1

Preparation of $(GaSb)_{1-x}(InAs)_x$ Alloys

Quasi-binary $(GaSb)_{1-x}(InAs)_x$ alloys were synthesized from pre-compounded InAs and GaSb. The synthesis was carried out in 20–32 mm diameter silica crucibles in a multi-zone Mellen furnace (such as the one used in Dutta, which is hereby incorporated by reference). A submerged heater was employed to homogenize the melt during synthesis as described in Ostrogorsky I, which is hereby incorporated by reference. Prior to use, the presynthesized GaSb and InAs were freshly etched with CP4 etchant ($CH_3COOH:HF:HNO_3$ in a volume ratio of 3:3:5). Melt encapsulation was provided by boric oxide ($B_2O_3$) or alkali halide salts (LiCl—KCl and NaCl—KCl). Boric oxide encapsulation was found to be more satisfactory and suitable (due to its extremely low vapor pressure and high viscosity) for inhibiting volatilization from the melt surface. The growth chamber was usually pressurized more than 1 atm by argon gas to prevent decomposition of InAs. It was observed that if the melt was not pressurized properly, the compounds tended to decompose and, consequently, to form GaAs and InSb rich phases upon solidification. Synthesis was done at various temperatures in the range of 712–945° C. The lower and upper limits of this range correspond to the melting points of GaSb and InAs, respectively. When synthesizing $(GaSb)_x(InAs)_{1-x}$, the temperature of the Mellen furnace's "hot zones" was in the range of 720 to 950° C. At the end of the synthesis cycle, the crucible was lowered at a constant rate of 3.3 mm/hr through a temperature gradient of 15–50 K/cm. When solidification was complete, the furnace was cooled slowly to room temperature over a period of several hours. Crystal growth was performed either without seed by self nucleation or on GaSb seed using conventional vertical Bridgman techniques (Dutta et al., "The Physics and Technology of Gallium Antimonide: An Emerging Optoelectronic Material," *J. Appl. Phys.*, 81:5821–5870 (1997) and Dutta, which are hereby incorporated by reference) in either flat bottom or conical tipped crucibles.

FIG. 1 is a photograph of a typical as-grown quasi-binary crystal of $(GaSb)_{0.97}(InAs)_{0.03}$.

Example 2

Properties of $(GaSb)_x(InAs)_{1-x}$ and Comparison of $(GaSb)_x(InAs)_{1-x}$ With Conventionally Prepared Quaternary Alloys After growth, the ingots of $(GaSb)_x(InAs)_{1-x}$ were sliced parallel to the growth axis to evaluate the structural and compositional properties. To reveal the microscopic grain structure, the ingots were chemically treated with a 1:1:1 mixture of HCl, 30% $H_2O_2$, and water. This treatment was followed by sequentially dipping the ingot in deionized ("DI") $H_2O$; treating it with a mixture of 34.2 g $CrO_3$, 5 ml HF, and 125 ml water; and treating the ingot with a $H_2O$ dip and a soap solution rinse. The composition of the grown crystals (Ga, In, Sb, As) were evaluated using Electron Probe Micro-Analysis ("EPMA") measurements in a JEOL 733 electron microprobe set-up. The standards used were InAs and GaSb single crystal substrates. Atomic number absorption fluorescence ("ZAF") corrections were performed by employing the commercial software SCOTT-I. The error in determining the composition was in the order of 1–2% of the measured values. Crystal microstructure was studied using Secondary Electron Microscopy ("SEM") in the EPMA set-up. Band gaps were determined by Fourier Transform Infrared ("FTIR") spectroscopy measurements at room temperature.

Figure 2A:
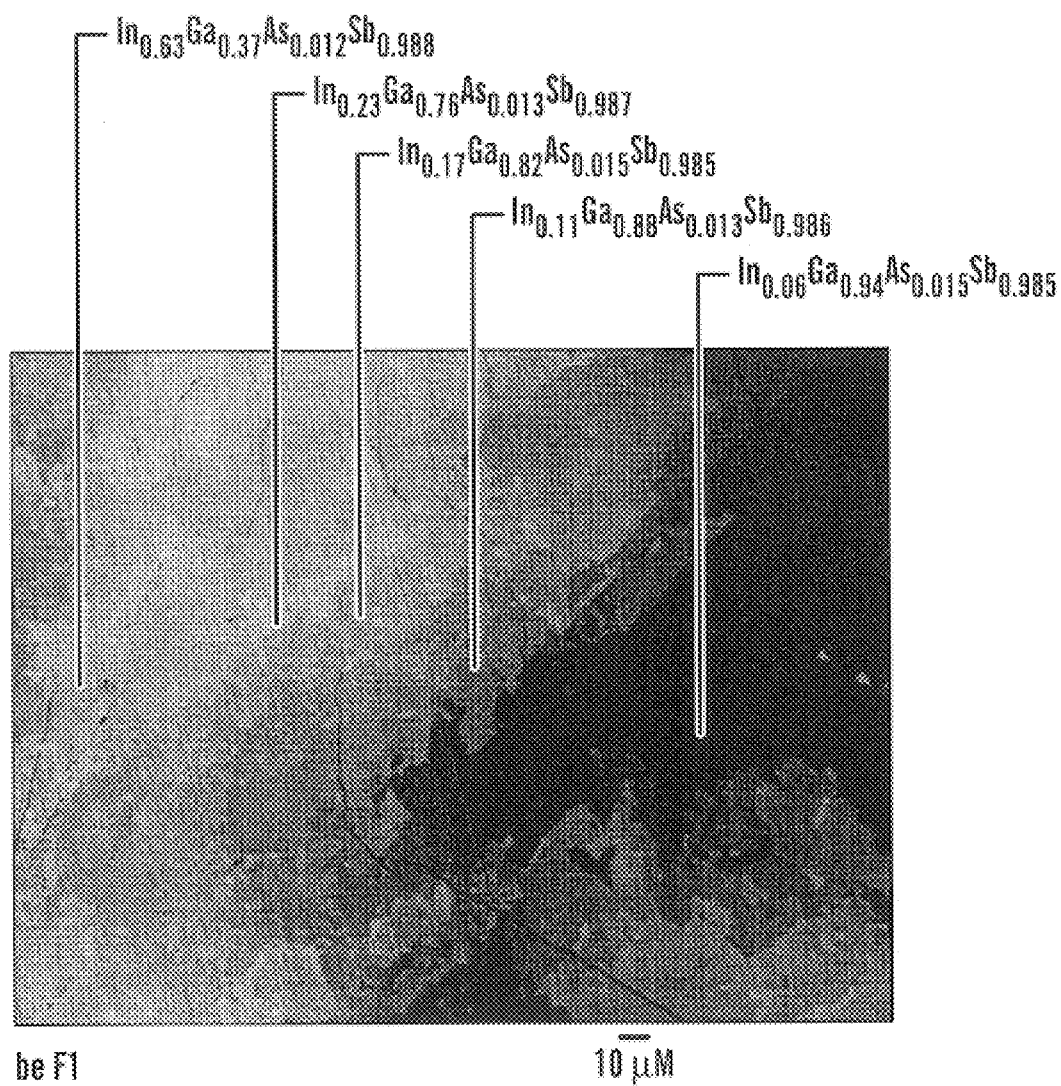
FIGS. 2A–2C are Secondary Electron Microscopy ("SEM") photomicrographs of GaInAsSb quaternary alloys prepared from Ga, In, Sb, and InAs at 900° C.
Figure 2B:
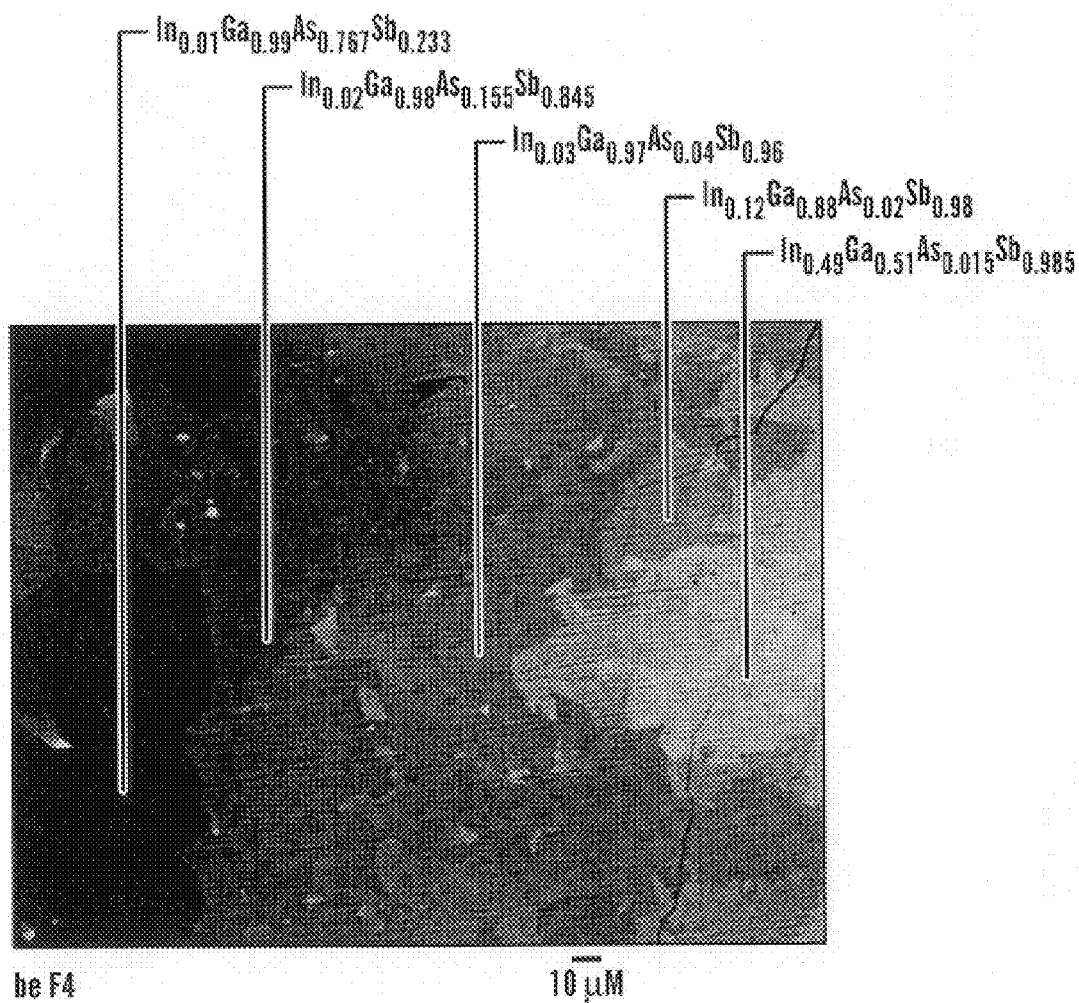
Figure 2C:
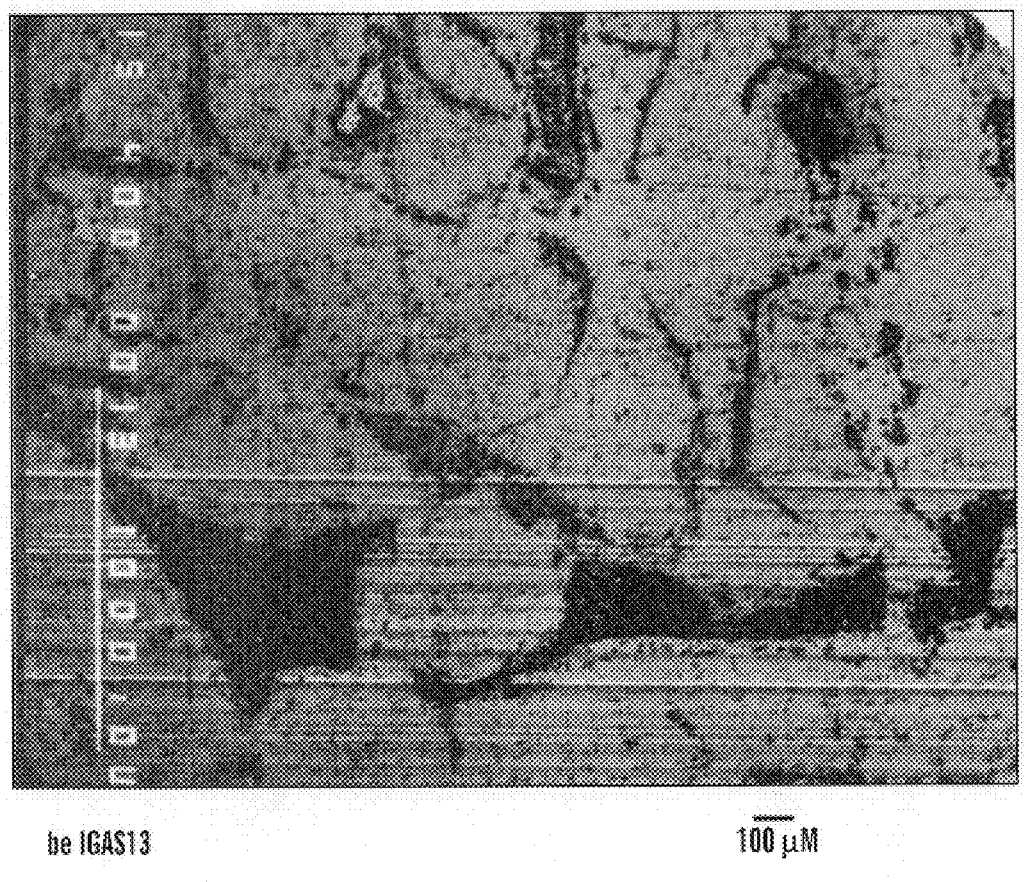

In the absence of any phase diagram, initial studies focussed on studying the microstructure of various materials that were synthesized at varying temperatures and charge preparation cycle. After rigorous experimentation, it was determined that synthesis temperature beyond the melting point of InAs (940° C.) with elemental Ga and Sb tended to produce multi-phase materials as indicated in the SEM photomicrograph shown in FIG. 2A. Spatial inhomogeneity in the composition of the crystal is created due to the multi-phase formation. It is believed that this occurs due to the decomposition of InAs and subsequent formation of random mixed alloys. Such random multi-phase formation has also been encountered in our previous work in quaternary $Ga_{1-x}In_xAs_ySb_{1-y}$. FIG. 2B shows the microstructure of such an alloy synthesized from a melt containing 20 mol % In, 80 mol % Ga, 13 mol % As, and 87 mol % Sb at 950° C. The source of arsenic was provided by compounded GaAs. The multi-phase formation is attributed to the presence of elemental sources. Phase separation from a regular solution in quaternary systems are thermodynamically expected (Bachmann, which is hereby incorporated by reference). Low synthesis temperature (and from elemental sources) improves the compositional homogeneity; however, it does not fully avoid the formation of multiple phases. FIG. 2C shows inclusions in the quaternary crystals synthesized at 800° C. from the same melt composition that was used to form the crystal shown in FIG. 2B. As a result of these preliminary studies, it was concluded that charge synthesis needs to be carried out from compounded sources.

Figure 3A:
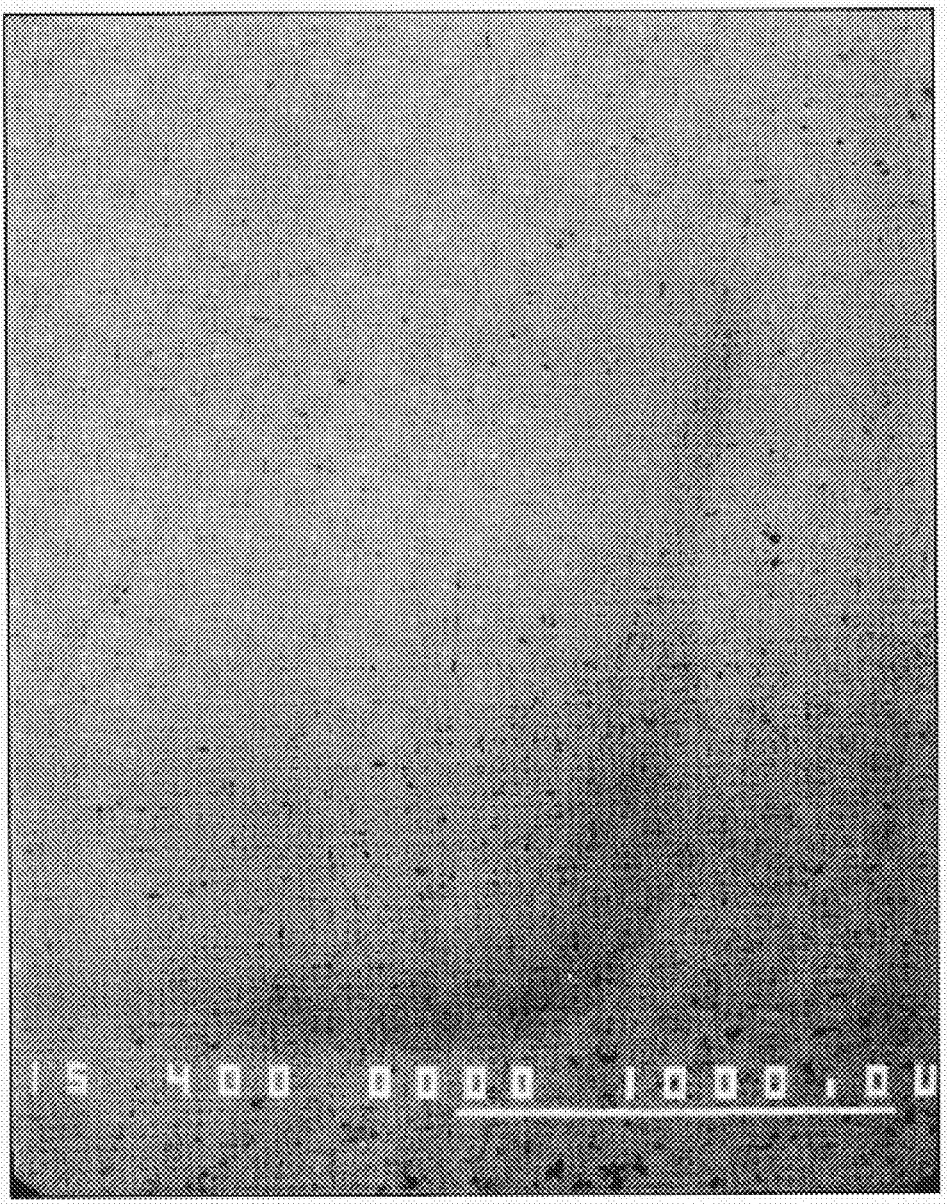
FIG. 3A is a SEM photomicrograph of an alloy prepared from GaSb and InAs.
Figure 3B:
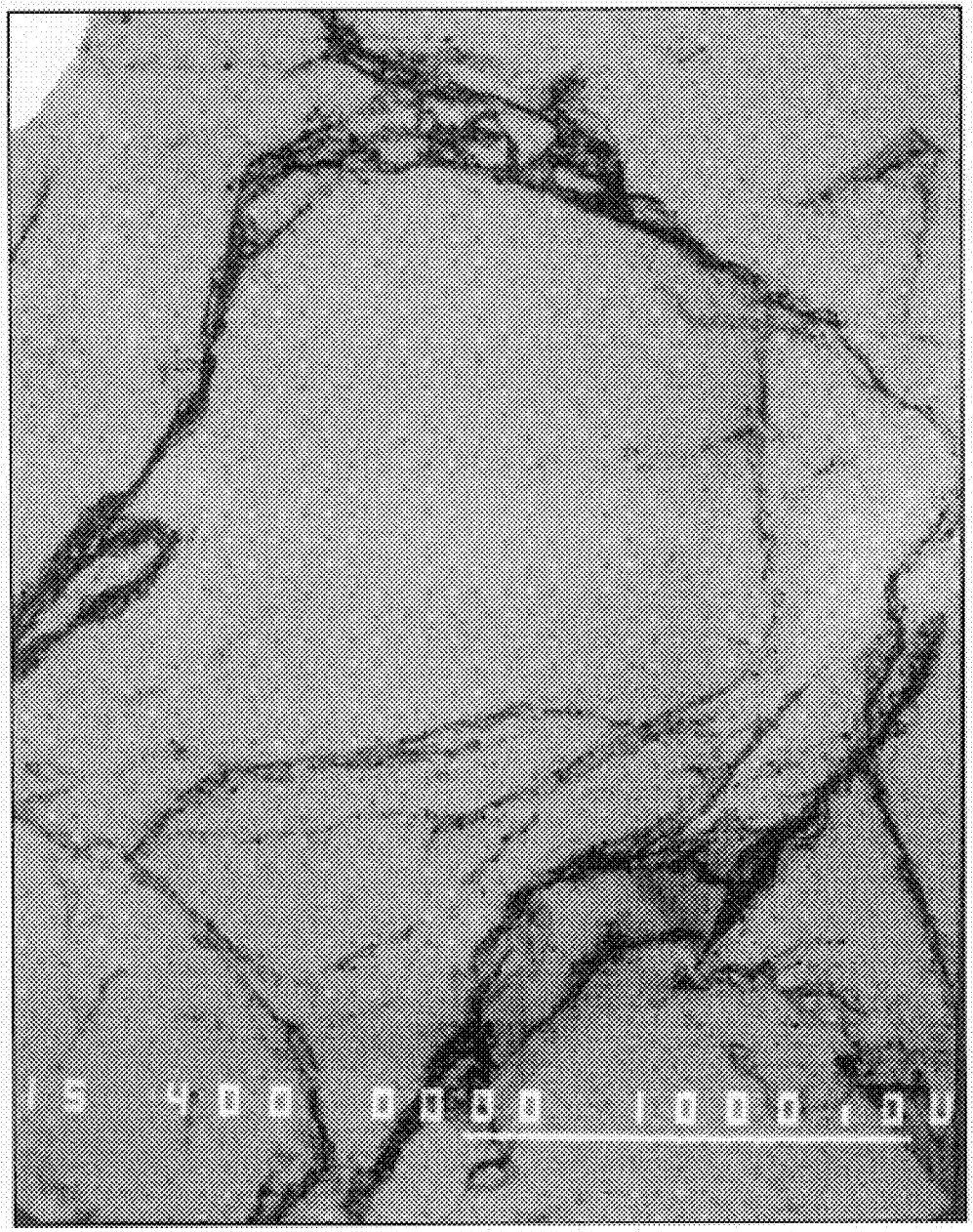
FIG. 3B is a SEM photomicrograph of an alloy prepared from GaSb and InSb.

Typical microstructure of the quasi-binary $(GaSb)_{1-x}$—$(InAs)_x$ synthesized in the temperature range of 720–850° C. is depicted in FIG. 3A. The crystals are completely single phase in nature and have crystalline and chemical perfection significantly better than ternary and quaternary alloys grown in bulk. Unlike ternary alloys of $(GaSb)_{1-x}(InSb)_x$, the quasi-binary alloy shown in FIG. 3A does not exhibit any cracks. It is believed that this is due to 10 times less lattice mismatch of InAs and GaSb compared to InSb and GaSb.

Figure 4A:
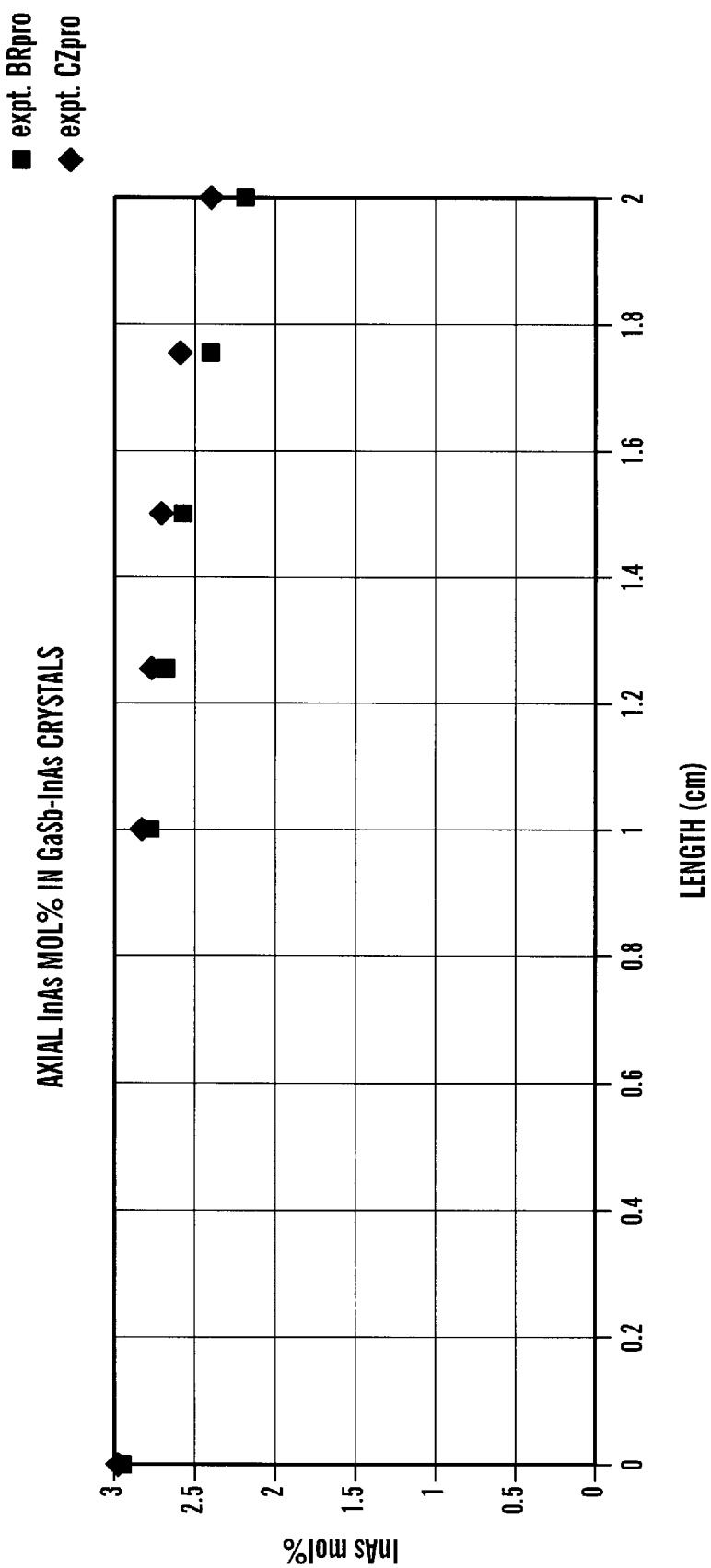
FIG. 4A is a graph showing the axial profile of InAs concentration in a GaSb-InAs quasi-binary alloy prepared in accordance with a method of the present invention.
Figure 4B:
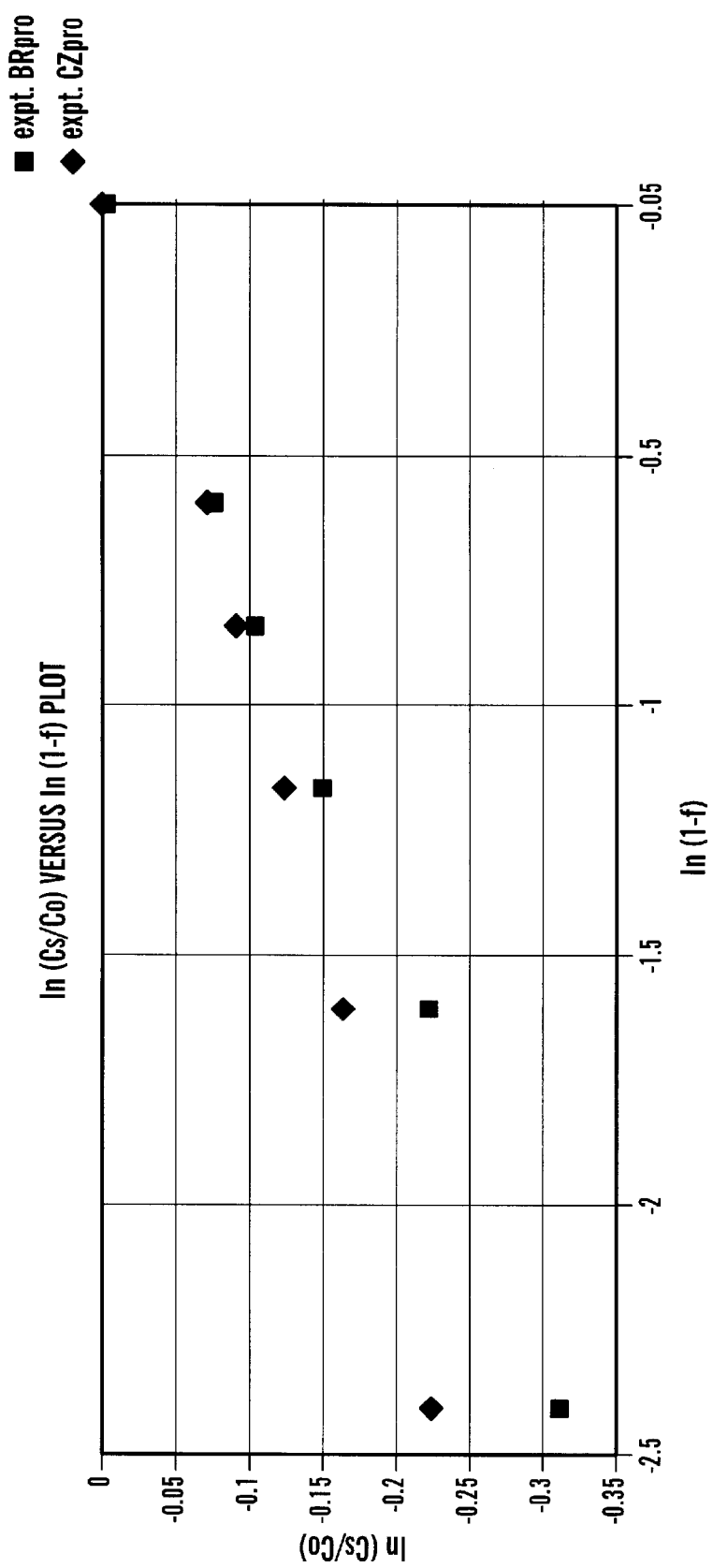
FIG. 4B is a graph of $\ln(C_o/C_s)$ versus $\ln(1-f)$ to determine the segregation coefficient, k, of a GaSb-InAs quasi-binary alloy prepared in accordance with a method of the present invention.

FIG. 4A is a graph showing shows the axial profile of InAs in the crystal grown from an initially homogenized melt consisting of 97 mol % GaSb and 3 mol % InAs. The uniform InAs content shown in FIG. 4A indicates virtually no segregation during growth. To determine the segregation coefficient, k, $\ln(C_s/C_o)$ was plotted as a function of $\ln(1-f)$, where $C_s$ is the InAs content in the solid, $C_o$ is the InAs concentration in the initial homogenized melt, and f is the fraction of melt that is solidified. One such plot is shown in FIG. 4B. The slope of the plot gives the value of k, which was estimated to be in the range of 1.05–1.12 from different sets of experiments including the plot shown in FIG. 4B. The segregation coefficient approaching unity is an important advantage of the quasi-binary alloys of the present invention, because it shows that crystals with uniform alloy composition can be grown by simple directional solidification. FTIR spectroscopy revealed that band gaps of the materials prepared as in Example 1 have narrower band gaps relative to conventional quaternary materials.

Although the invention has been described in detail for the purpose of illustration, it is understood that such detail is solely for that purpose, and variations can be made therein by those skilled in the art without departing from the spirit and scope of the invention which is defined by the following claims.

What is claimed:

1. An alloy having the formula $(AB)_x(CD)_{1-x}$, wherein x is between 0 and 1 comprising:
   a first element A, wherein A is Ga;
   a second element B, wherein B is Sb;
   a third element C; and
   a fourth element D, wherein first element A and second element B are present as a binary compound AB and wherein third element C and fourth element D are present as a binary compound CD and wherein said alloy is substantially free from binary compounds AD, BC, AC, and BD and wherein binary compound AB and binary compound CD have similar lattice constants and wherein said alloy is a single phase material.

2. An alloy according to claim 1, wherein each first element A and each second element B is present as a binary compound AB and wherein each third element C and each fourth element D is present as a binary compound CD.

3. An alloy according to claim 1, wherein each first element A is bonded directly to each second element B and wherein each third element C is bonded directly to each fourth element D.

4. An alloy according to claim 1, wherein said alloy is a semiconductor.

5. An alloy according to claim 1, wherein said alloy is a single crystal.

6. An alloy according to claim 1, wherein the ratio of binary compound AB's lattice constant to binary compound CD's lattice constant is from about 0.95 to about 1.05.

7. An alloy according to claim 6, wherein the ratio of binary compound AD's lattice constant to binary compound BC's lattice constant is greater than about 1.05 or less than about 0.95.

8. An alloy according to claim 1, wherein C is a Group IIIA element and D is a Group VA element or C is a Group IIB element and D is a Group VIA element.

9. An alloy according to claim 1, wherein A, B, C, and D are different elements.

10. An alloy according to claim 1,
    wherein A is Ga, B is Sb, C is In, and D is As;
    wherein A is Ga, B is Sb, C is Zn, and D is Te;
    wherein A is Ga, B is Sb, C is Cd, and D is Se; or
    wherein A is Ga, B is Sb, C is Hg, and D is Se.

11. An alloy according to claim 1 having a formula selected from the group consisting of $(GaSb)_x(InAs)_{1-x}$, $(GaSb)_x(ZnTe)_{1-x}$, $(GaSb)_x(CdSe)_{1-x}$, and $(GaSb)_x(HgSe)_{1-x}$, wherein x is between 0 and 1.

12. An alloy according to claim 1 further comprising:
    a fifth element E and
    a sixth element F, wherein each fifth element E and each sixth element F is present as a binary compound EF.

13. An alloy according to claim 12, wherein binary compound EF has a lattice constant that is similar to that of AB and CD.

14. An alloy according to claim 12 having the formula $(AB)_x(CD)_y(EF)_{1-x-y}$, wherein x is from 0 to 1, y is from 0 to 1, and the sum of x and y is less than 1.

15. An alloy according to claim 1 further comprising:
    a dopant in an amount effective to make the alloy an n-type semiconductor.

16. An alloy according to claim 1 further comprising:
    a dopant in an amount effective to make the alloy a p-type semiconductor.

17. An alloy having the formula $(AB)_x(CD)_{1-x}$, wherein x is between 0 and 1, comprising:
    a first element A;
    a second element B;
    a third element C, wherein C is In; and
    a fourth element D, wherein D is As, and wherein first element A and second element B are present as a binary compound AB and third element C and fourth element D are present as a binary compound CD and wherein said alloy is substantially free from binary compounds AD, BC, AC, and BD and wherein binary compound AB and binary compound CD have similar lattice constants and wherein said alloy is a single phase material.

18. An alloy according to claim 17, wherein each first element A and each second element B is present as a binary compound AB and wherein each third element C and each fourth element D is present as a binary compound CD.

19. An alloy according to claim 17, wherein each first element A is bonded directly to each second element B and wherein each third element C is bonded directly to each fourth element D.

20. An alloy according to claim 17, wherein said alloy is a semiconductor.

21. An alloy according to claim 17, wherein said alloy is a single crystal.

22. An alloy according to claim 17, wherein the ratio of binary compound AB's lattice constant to binary compound CD's lattice constant is from about 0.95 to about 1.05.

23. An alloy according to claim 22, wherein the ratio of binary compound AD's lattice constant to binary compound BC's lattice constant is greater than about 1.05 or less than about 0.95.

24. An alloy according to claim 17, wherein A is a Group IIIA element and B is a Group VA element or A is a group IIB element and B is a group VIA element.

25. An alloy according to claim 17, wherein A, B, C, and D are different elements.

26. An alloy according to claim 17,
    wherein A is Ga, B is Sb, C is In, and D is As; or
    wherein A is Al, B is Sb, C is In, and D is As.

27. An alloy according to claim 17 having a formula selected from the group consisting of $(GaSb)_x(InAs)_{1-x}$ or $(AlSb)_x(InAs)_{1-x}$, wherein x is between 0 and 1.

28. An alloy according to claim 17 further comprising:
    a fifth element E and
    a sixth element F, wherein each fifth element E and each sixth element F is present as a binary compound EF.

29. An alloy according to claim 28, wherein binary compound EF has a lattice constant that is similar to that of AB and CD.

30. An alloy according to claim 28 having the formula $(AB)_x(CD)_y(EF)_{1-x-y}$, wherein x is from 0 to 1, y is from 0 to 1, and the sum of x and y is less than 1.

31. An alloy according to claim 17 further comprising:
    a dopant in an amount effective to make the alloy an n-type semiconductor.

32. An alloy according to claim 17 further comprising:
    a dopant in an amount effective to make the alloy a p-type semiconductor.

* * * * *